United States Patent
Starkey

(10) Patent No.: US 7,474,009 B2
(45) Date of Patent: Jan. 6, 2009

(54) OPTOELECTRONIC MOLDING COMPOUND THAT TRANSMITS VISIBLE LIGHT AND BLOCKS INFRARED LIGHT

(75) Inventor: Dale R. Starkey, Olean, NY (US)

(73) Assignee: Henkel Corporation, Rocky Hill, CT (US)

(*) Notice: Subject to any disclaimer, the term of this patent is extended or adjusted under 35 U.S.C. 154(b) by 445 days.

(21) Appl. No.: 11/027,909

(22) Filed: Dec. 30, 2004

(65) Prior Publication Data
US 2006/0147718 A1 Jul. 6, 2006

(51) Int. Cl.
H01L 23/29 (2006.01)
F21V 9/04 (2006.01)
G02B 5/22 (2006.01)
C08L 63/00 (2006.01)

(52) U.S. Cl. ............ 257/788; 252/582; 252/587; 257/787; 523/400; 523/440; 525/526; 525/533

(58) Field of Classification Search ........... 525/523, 525/524, 525, 526, 533; 523/400, 427, 440; 252/582, 587; 438/127; 428/413, 418; 257/787, 257/788, 793
See application file for complete search history.

(56) References Cited

U.S. PATENT DOCUMENTS

| | | | |
|---|---|---|---|
| 3,849,383 A | | 11/1974 | Fetscher et al. |
| 3,903,413 A | | 9/1975 | Manning et al. |
| 4,913,846 A | * | 4/1990 | Suzuki et al. ........... 252/587 |
| 6,208,393 B1 | | 3/2001 | Bawolek et al. |
| 2006/0049533 A1 | * | 3/2006 | Kamoshita ............... 264/1.7 |

FOREIGN PATENT DOCUMENTS

| | | |
|---|---|---|
| EP | 1152035 | 11/2001 |
| EP | 1 411 102 | 4/2004 |
| JP | 55-050021 A1 * | 4/1980 |
| JP | 60035018 | 2/1985 |
| JP | 2000 332424 | 11/2000 |
| WO | WO 00/19252 | 4/2000 |
| WO | WO 03/098351 | 11/2003 |
| WO | WO 2004/066398 A1 * | 8/2004 |

OTHER PUBLICATIONS

Abstract of JP 55-050021, provided by the JPO website (1980).*
Database WPI Section Ch, Week 198514; Derwent Publications, Ltd.; London, GB; Class A21, AN 1985-084088 XP002372174 and JP 60 035018 A (Sumitomo Baskelite CO), Feb. 22, 1985 Abstract.

* cited by examiner

Primary Examiner—Michael J Feely
(74) Attorney, Agent, or Firm—Steven C. Bauman

(57) ABSTRACT

A molding compound for use in encapsulating electronic packages which include an optoelectronic component, such as an LED or optical sensor. The molding compound includes a partially-cured epoxy composition, a linear polyol, a dye that absorbs in the region of above 700 nm to about 1200 nm and substantially transmits light from about 400 nm to about 700 nm, and an optional antioxidant material substantially uniformly distributed throughout the epoxy composition. The dye can be dissolved within the epoxy composition by heating a portion of the epoxy composition prior to B-staging of the molding compound. The cured epoxy composition has at least 40% transmittance at 600 nm, less than 10% transmittance at 900 nm, less than 10% transmittance at 1100 nm.

20 Claims, 6 Drawing Sheets

OPTOELECTRONIC MOLDING COMPOUND THAT TRANSMITS VISIBLE LIGHT AND BLOCKS INFRARED LIGHT

BACKGROUND OF THE INVENTION

1. Field of the Invention

The present invention relates to epoxy molding compositions. More particularly, the present invention relates to epoxy molding compositions which are particularly useful as encapsulants for light sensing devices.

2. Brief Description of Related Technology

Epoxy resin compositions are widely used for electronic packaging materials in the electronics industry and, in particular, as encapsulants for semiconductor elements and electronic circuits. Accordingly, epoxy resin-based compositions have been widely used in the formation of molding compositions for use as electronic packaging materials. Transparent epoxy molding compositions are well known for use as encapsulants in connection with light-emitting diodes (LEDs) for use in lighting applications in the electronics industry.

As a particular example, silicon-based devices are typically sensitive to light with wavelengths up to about 1200 nm. If the infrared (IR) light is permitted to enter the sensor, the sensor responds to the infrared light and generates a spurious signal.

Optical sensors that transmit visible light are commonly used in electronic applications, but can be susceptible to transmission of infrared light. Accordingly, visible light or optical sensors can use an infrared blocking element to prevent infrared radiation from entering the light sensor. Liquid crystal color filters may be used. These filters are electronically switchable because they include an electronically controllable liquid crystal element. By electronically controlling the polarization of the liquid crystal element, the light that is transmitted through the filter may be controlled. In this manner, a given wavelength band may be transmitted through a given filter. In effect, the liquid crystal color filter may be tuned to a particular color. The liquid crystal color filters may be tuned to a pair of colors and, through color combination, may produce a third color. Thus, a liquid crystal color filter may form a switchable shutter which can controllably produce red, green and blue primary color bands or complementary color bands such as cyan, magenta and yellow.

U.S. Pat. No. 6,208,393 to Bawolek et al. discloses a liquid crystal color filter that includes an infrared blocking dye integrated within the filter to prevent infrared radiation from adversely affecting the performance of the filter when used in an imaging system. The dye may be incorporated into a liquid crystal element in the filter or may be coated on components of the filter. Suitable dyes are transmissive of light in the visible range and substantially absorbent of light in the infrared range from approximately 800 nm to 1200 nm in wavelength.

EP 1 152 035 discloses a preform for a polyester resin composition blow molded product that includes a polyester resin and an infrared absorbing colorant, which is at least one colorant selected from a phthalocyanine infrared absorbing colorant and a naphthalocyanine infrared absorbing colorant, which has an infrared maximum absorption peak in the region of 700 nm to 2000 nm.

In some cases, dyes are included in polycarbonate filtering lenses, which are attached to visible light or optical sensors using clear epoxy compositions, to act as an infrared blocking element to prevent infrared radiation from entering the light sensor. Such two-part lens-epoxy systems are undesirable as they require additional steps during manufacture and are generally more expensive than using epoxy compositions alone.

Additionally, the heretofore known filters can be an expensive, in some applications an overly bulky, and in other cases provide an insufficient, solution to the problem of filtering infrared radiation.

Therefore, it would be desirable to provide encapsulant materials that are capable of transmitting visible light while blocking infrared light to act as filters for optoelectronic devices such as visible light or optical sensors.

SUMMARY OF THE INVENTION

An epoxy composition of the invention comprises an epoxy containing component; an anhydride containing component; a dye that absorbs infrared (IR) radiation in the region of above 700 nm to about 1200 nm and substantially transmits light in the region of about 400 nm to 700 nm; and a linear polyol, where the composition, when cured, has at least a 40% transmittance at 600 nm, less than 10% transmittance at 900 nm and less than 10% transmittance at 1100 nm.

In a further embodiment, the invention provides an encapsulant material for electronic components including a molding compound comprising a reaction product of a partially-cured epoxy component and an anhydride component. The molding compound further includes a linear polyol and an IR absorbing dye, as described above, and optionally an antioxidant material substantially uniformly distributed therethrough.

The invention further provides a method of preparing a molding compound involving providing an epoxy composition; mixing an IR absorbing dye, a linear polyol and an optional antioxidant material with the epoxy composition to provide a homogeneous mixture; increasing the viscosity of the homogeneous mixture to form a pre-reacted intermediate; and partially curing the epoxy composition of the pre-reacted intermediate, thereby forming the molding compound.

Another method of preparing a molding compound includes providing an epoxy composition comprising an epoxy component and an anhydride component; mixing a linear polyol, an IR absorbing dye, as described above, and an optional antioxidant material with the epoxy composition at a temperature of about 105° C. to about 115° C. to provide a homogeneous mixture; cooling the mixture to a temperature of about 50° C. to about 75° C.; adding a polyol to the mixture for reaction with the anhydride component; increasing the temperature of the mixture to about 70° C. to about 85° C. for a time period of about 10 minutes to about 60 minutes to cause an increase in the viscosity of the mixture; and B-staging the epoxy composition at a temperature of about 60° C. to about 70° C., thereby forming the molding compound.

A method of encapsulating an optoelectronic device further includes providing an optoelectronic device; providing a molding compound comprising a partially-cured epoxy composition having a linear polyol, an IR absorbing dye, as described above, and an optional antioxidant material; encapsulating the optoelectronic device with the molding compound; and fully curing the epoxy composition.

In a further embodiment, an optoelectronic device includes an optical sensor or a light-emitting diode having an encapsulant surrounding the sensor or light-emitting diode. The encapsulant comprises a reaction product of a cured epoxy composition including a linear polyol, an IR absorbing dye, as described above, and an optional antioxidant material.

DETAILED DESCRIPTION OF THE INVENTION

Figure 1:
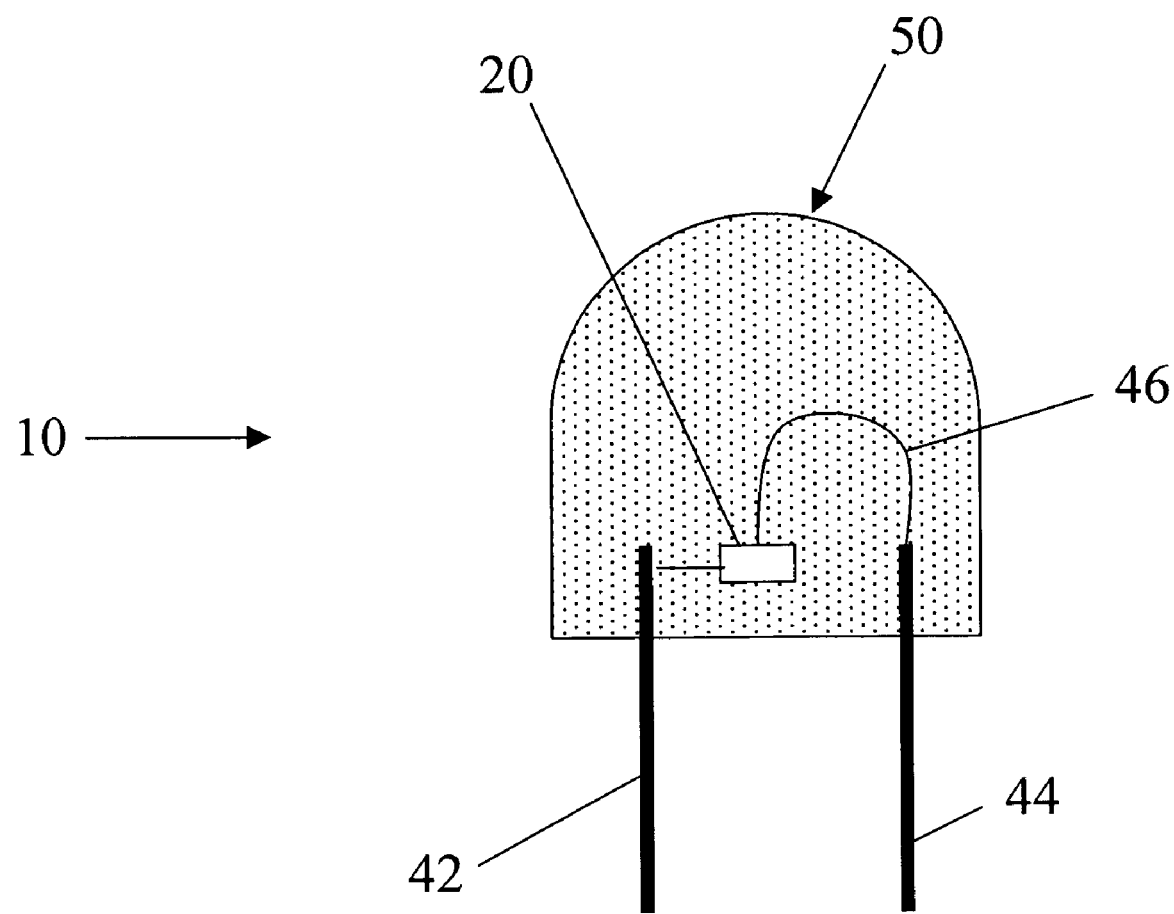
FIG. 1 is a schematic diagram of an optoelectronic device in accordance with the present invention.

As used herein, spatial or directional terms, such as "left," "right," "inner," "outer," "above," "below," "top," "bottom" and the like, relate to the invention as it is shown in the drawing figures. However, it is to be understood that the invention may assume various alternative orientations and, accordingly, such terms are not to be considered as limiting.

Further, as used herein, all numbers expressing dimensions, physical characteristics, processing parameters, quantities of ingredients, reaction conditions and the like used in the specification and claims are to be understood as being modified in all instances by the term "about." Accordingly, unless indicated to the contrary, the numerical values set forth in the following specification and claims are approximations that may vary depending upon the desired properties sought to be obtained by the present invention. At the very least, and not as an attempt to limit the application of the doctrine of equivalents to the scope of the claims, each numerical value should be construed in light of the number of reported significant digits and by applying ordinary rounding techniques. Moreover, all ranges disclosed herein are to be understood to include the beginning and ending range values and to encompass any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 5.5 to 10.

Unless stated otherwise, as used in the specification and claims, molecular weights are number average molecular weights for polymeric materials indicated as "$M_n$" and obtained by gel permeation chromatography using polystyrene as a standard.

Unless stated otherwise, as used in the specification and claims, "linear polyol" refers to straight chain aliphatic molecules containing two or more hydroxyl groups that can further contain O, S and/or N heteroatoms in the straight chain. The linear polyols used herein do not have more than one methyl group substituent on any chain atom and do not have long chains (2 carbon atoms and above) pendant from the main chain. Non-limiting example of linear polyols that can be used in the invention include glycerol, ethylene glycol, diethylene glycol, propylene glycol, dipropylene glycol, triethylene glycol, tripropylene glycol, and mixtures thereof. The linear polyols used in the present invention do not include bulky compounds such as neopentyl glycol or 2,2,4-trimethyl-1,3-pentanediol.

The present invention is directed to a composition of matter and, in one particular embodiment, to a molding compound, such as for use in encapsulating optoelectrical devices such as light emitting diodes and optical sensors. The composition includes:

a) an epoxy containing component;

b) an anhydride containing component;

c) a dye that absorbs infrared radiation in the region of above 700 nm to about 1200 nm and substantially transmits light in the region of about 400 nm to 700 nm; and d) a linear polyol.

As noted, the molding compound of the present invention includes an epoxy composition. The epoxy composition can be a substantially transparent epoxy composition capable of transmitting light to an optical sensor, as is known in the art. In one application, the epoxy composition used in the molding compound of the present invention can be the reaction product of an anhydride of a cyclic dibasic acid and an epoxy containing compound.

The cyclic anhydride component used in the present invention can be a cycloaliphatic anhydride such as, but not limited to, hexahydrophthalic anhydride (HHPA) or methyl hexahydrophthalic anhydride (MHHPA). Small quantities of other related anhydrides such as, but not limited to, tetrahydrophthalic anhydride and phthalic anhydride may be present with the cyclic anhydride. In one embodiment, these other related anhydrides, if present, are present in an amount of no more than 25% of the total cyclic acid anhydride content, e.g., 5% to 25%, for best results.

As the epoxy component, any thermosetting epoxy resin may be used which is capable of being B-staged, as will be discussed in more detail herein. Particularly desirable are solid epoxy resins and, in particular, tri- or multi-functional epoxy resins. Non-limiting examples of useful epoxy resins include solid epoxy resins derived from bisphenol A or F, tetramethyl and/or biphenyl, and epichlorohydrin, novalacs and the like. Triglycidyl isocyanurate (TGIC) is particularly desirable. An example of a particularly useful product is tris(2,3-epoxy propyl) isocyanurate, sold under the tradename TEPIC® by Nissan Chemical Industries Pty Ltd.

Examples of other useful epoxy components include epoxy monomers characterized by structures I and II below.

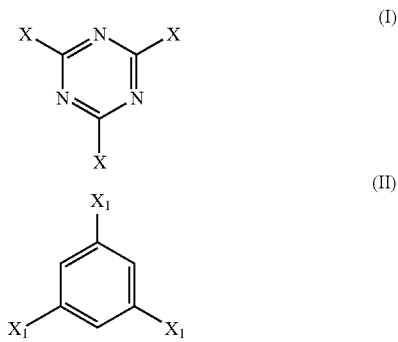

In structure I, X can be present at least once (i.e., mono-, di-, or tri-substituted) and may be chosen from H or $D_nA$, where n can range between 0 and 1, with at least one X being $D_nA$. D, if present (i.e., if n=1), can be attached to the ring and can be chosen from O, S, or NH. A can be attached to D (if present) or directly to the ring (if D is not present, i.e., n=0). A can be represented by structure III below:

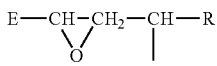 (III)

where E can be a member selected from H, linear, branched or cyclic alkyl, alkenyl, alkynyl, alkoxy or aryl groups, having from 1 to 20 carbon atoms with or without substitution by halogen, silicon, hydroxy, nitrile, ester, amide or sulfate. R can be selected from H, linear, branched or cyclic alkyl, alkenyl, alkynyl, alkoxy or aryl groups, having from 1 to about 20 carbon atoms, with or without substitution by halogen, silicon, hydroxy, nitrile, ester, amide or sulfate.

$X_1$ can be present at least once on structure II (i.e., mono-, di-, or tri-substituted) and may be chosen from H or O=$CD_nA$, with at least one $X_1$ being O=$CD_nA$, where $D_n$ and A can be as defined above.

Another suitable epoxy component can be represented as:

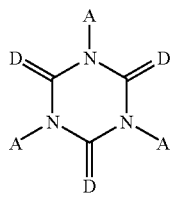 (IV)

where D and A can be as described above and can be present at least once and can also be present together attached to ring atoms which are in alpha-beta relation to one another.

Examples of particular epoxy components incorporating the above concepts include, but are not limited to, those shown in formulas V-VII below.

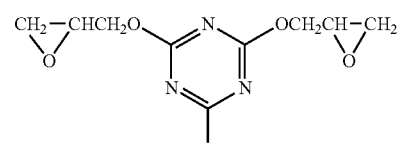 (V)

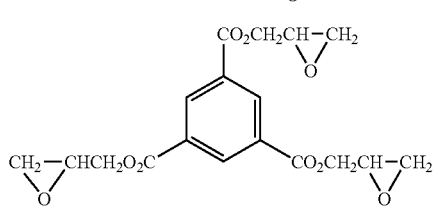 (VI)

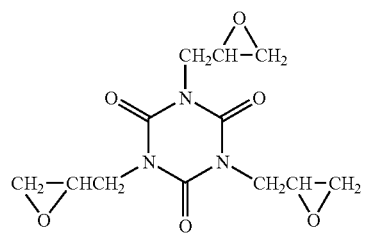 (VII)

In order to promote reaction of the cyclic anhydride component and the epoxy component, the anhydride ring must be opened. Various agents can be incorporated into the epoxy composition to assist in this ring opening reaction. Such ring opening can be accomplished, for example, by active hydrogens present as water, or by hydroxyls, or by a Lewis base.

In the present invention, a linear polyol is incorporated into the epoxy composition to assist in the ring opening of the anhydride and to promote curing of the epoxy composition. The polyol can be a lower linear aliphatic polyol of 3 to 6 carbon atoms and 2 to 4 hydroxyls, such as of 3 hydroxyls, although in some cases minor proportions of other polyols may be blended in, provided that they do not adversely affect the molding compound properties. Suitable linear polyols include, but are not limited to, glycerol, ethylene glycol, diethylene glycol, propylene glycol, dipropylene glycol, triethylene glycol, tripropylene glycol, and mixtures thereof. Other polyols of the group described may be utilized in minor proportions, generally being less than 25%, e.g., 5% to 25%, of the polyol content. Among these are neopentyl glycol and propoxylated pentaerythritol, a tetrol having a molecular weight of about 400, sold under the name Pluracol® PEP450 by BASF Corp. This propoxylated pentaerythritol may be used in small quantities, generally being limited to 5% to 25% of the polyol content, preferably on a hydroxyl content basis. In the selection of the "supplementing" polyols, it will often be most desirable to employ those which are liquid at room temperature or with heating to comparatively low temperatures. However, comparatively high melting materials, e.g., pentaerythritol, may be employed, preferably as a small proportion of polyol component.

The various reactants can be essentially pure, e.g., over 95% pure, such as over 99% pure, such as 99.9% to 100% pure. Of course, they should be clean and colorless and water content is to be avoided.

Although the reactions to make the molding compounds and, subsequently, to cure them may be effected without a catalyst, sometimes, in order to speed the reaction, the presence of a catalyst may be useful. It has been found that a relatively small group of catalytic materials, tin soaps of fatty acids of 8 to 18 carbon atoms, zinc octoate and quaternary phosphonium compounds, can exert a catalytic effort without impairing the clarity, colorless nature and other desirable properties of the molding compound and the finished cured product.

In addition to the epoxy composition, the molding compounds of the present invention further can include one or more antioxidant materials. The antioxidant material(s) can be a material capable of enhancing the UV and/or heat resistance of the molding compound. The antioxidant material can be selected from any known antioxidant material which can enhance the UV and/or heat resistance of the molding compound. Examples of suitable antioxidants include, but are not limited to, primary (phenolic) antioxidants and, desirably, esters having pendant hydroxyphenyl groups. Particularly desirable are alkyl salts of propionic acid and, more desirably, those including a sulfur bridge. In one embodiment, the antioxidant material can include a thiodialkylpropionate such as, but not limited to, thiodiethylenepropionate. In one particular embodiment, the antioxidant material comprises thiodiethylene bis[3-(3,5-di-tert-butyl-4-hydroxyphenyl)propionate], commercially available from Ciba Specialty Chemicals under the tradename IRGANOX® 1035. Other useful antioxidants include those also commercially available from Ciba Specialty Chemicals under the tradename IRGANOX® 1010 and IRGANOX® 1076.

The molding compounds of the present invention further can include one or more adhesion promoters. The adhesion promoting material can be selected from any known adhesion promoters that include, but are not limited to, epoxy silanes and mercapto silanes.

In addition to the epoxy composition, the molding compounds of the present invention include one or more IR absorbing dyes. Any suitable dye can be used. Suitable dyes include those that absorb infrared radiation (i.e., have a $\lambda_{max}$) in the region of about 700 nm to about 1200 nm, in some cases from about 770 nm to about 1100 nm and in other cases from about 800 nm to about 1050 nm, and substantially transmit light (i.e., do not absorb light) in the region of about 400 nm to about 700 nm, in some cases about 450 nm to about 650 nm and in other cases about 475 nm to about 625 mn.

In an embodiment of the invention, a mixture of dyes having different absorption properties can be used. As a non-limiting example, the dyes can have different absorption maximums within the desired range in order to ensure that infrared radiation is completely blocked. Thus, an overall broad absorption within the desired range can be achieved.

Any suitable dye can be used in the invention, so long as it absorbs in the desired range and does not absorb, or absorbs minimally, in the stated transmission range. Non-limiting examples of suitable dyes include the SDA and MSA families of near infrared dyes available from H.W. Sands Corp., Jupiter, Fla., such as SDA5725, MSA6535, SDB6592, SDA6995, SDA7047, SDA7398, SDA7591, SDA7787, SDA7858, SDA7999, SDA8030, SDA8520, SDA8662, SDA8700, SDA8703, SDA8817, and mixtures of these dyes.

The present molding compound can be used for encapsulating optoelectrical devices such as light emitting diodes and optical sensors. As such, the cured molding compound or encapsulating composition must generally absorb infrared radiation and generally transmit light. However, it has been found that the transmission characteristics of the cured molding compound or encapsulating composition can, in some cases, be altered such that undesirable transmission of infrared radiation occurs due to deterioration of the dye during the curing process.

In the present invention, it has been found that undesirable deterioration of the dye during the curing process can be minimized and in some cases avoided by including a linear polyol, as described above, in the cured molding compound or encapsulating composition. When branched or bulky polyols, such as neopentyl glycol or 2,2,4-trimethyl-1,3-pentanediol, are used at too high of a level, unacceptable amounts of deterioration of the dye during the curing process occur, resulting in less absorption of IR light and less transmission of visible light. Thus, the inventive cured molding compounds or cured encapsulating compositions provide at least 40%, in some cases at least 45% and in other cases at least 50% transmittance at 600 nm; less than 10%, in some cases less than 7.5% and in other cases less than 5% transmittance at 900 nm; and less than 10%, in some cases less than 7.5% and in other cases less than 5% transmittance at 1100 nm. In an embodiment of the invention, the inventive cured molding compounds or cured encapsulating compositions provide transmittance of less than 10%, in some cases less than 7.5% and in other cases less than 5% transmittance at 850 nm.

Not wishing to be bound to any single theory, it is believed that the proportions of the various components of the molding compounds employed are such as to produce the monoester of the acid anhydride and have the glycidyl moiety of the triglycidyl isocyanurate react with the acid group resulting from the anhydride-polyol reaction. In the present reactions, it is possible that a molecule of polyol may react with both carboxyls which may be considered to have come from the anhydride, or polyol hydroxyls from different polyol molecules may each react with the carboxyls. Similarly, more than one glycidyl moiety of the triglycidyl isocyanurate may react with anhydride carboxyls and, in some cases, such reactions may be effected before the anhydride reacts with polyol. However, in most instances, the reactions may be considered to be those as initially described, with a polyol forming a monoester with an acid anhydride and a glycidyl moiety of triglycidyl isocyanurate reacting with a free carboxylic acid group generated by the previous reaction. Such reactions may be considered to be effected when the three reactants are simultaneously reacted.

Desirably, the molding compound includes from about 20 weight percent to about 75 weight percent of the epoxy containing compound based on the total weight of the molding compound, such as from about 30 weight percent to about 60 weight percent of the epoxy containing compound based on the total weight of the molding compound, more desirably from about 30 weight percent to about 50 weight percent of the epoxy containing compound based on the total weight of the molding compound.

The molding compound can include from about 20 weight percent to about 75 weight percent of the acid anhydride based on the total weight of the molding compound, such as from about 30 weight percent to about 55 weight percent of the acid anhydride based on the total weight of the molding compound, more desirably from about 40 weight percent to about 55 weight percent based on the total weight of the molding compound.

Additionally, the molding compound can include from about 5 weight percent to about 20 weight percent of the polyol based on the total weight of the molding compound, such as from about 5 weight percent to about 10 weight percent of the polyol based on the total weight of the molding compound.

The molding compound can include from about 0.01 weight percent to about 5 weight percent of the IR absorbing dye, such as about 0.5 weight percent to about 4 weight percent, more desirably about 0.75 weight percent to about 3 weight percent, based on the total weight of the molding compound. In an embodiment of the invention, the dye is included at from about 0.01 weight percent to about 0.1 weight percent of the molding compound.

The molding compound can optionally include from about 0.01 weight percent to about 5 weight percent of the antioxidant material, such as about 0.05 weight percent to about 1 weight percent, more desirably about 0.05 weight percent to about 0.5 weight percent, based on the total weight of the molding compound.

When a mold release agent is incorporated into the molding compound, such a mold release is desirably provided in an amount of from about 0.1 weight percent to about 10 weight percent based on the total weight of the composition.

Embodiments of the invention are directed to a method of preparing a molding compound that includes:

a) providing an epoxy containing component and an anhydride containing component;

b) mixing a linear polyol and a dye that absorbs infrared radiation and substantially transmits light as described above to provide a homogeneous mixture with a);

c) increasing the viscosity of said homogeneous mixture to form a pre-reacted intermediate; and d) partially curing said epoxy containing component of said pre-reacted intermediate, thereby forming said molding compound.

Desirably, the partially cured epoxy containing component composition, when molded and post cured, has at least a 40% transmittance at 600 nm, less than 10% transmittance at 900 nm and less than 10% transmittance at 1100 nm.

Thus, the preparation of the molding compound of the present invention can involve a pre-mixing of the epoxy composition with the dye and optional antioxidant material to provide a homogeneous mixture, wherein the dye and optional antioxidant material can be substantially evenly distributed within the epoxy composition. This may be accomplished by combining and mixing the epoxy compound, the anhydride component, the dye and the optional antioxidant material. Desirably, such mixing occurs at a temperature of from about 80° C. to about 140° C., more desirably from about 105° C. to about 110° C., for a period of about 10 minutes to about 20 minutes. No significant reaction occurs during this mixing step.

The thus-prepared mixture can be cooled to a temperature of about 45° C. to about 85° C., desirably about 60° C. to about 65° C. The polyol can then be added to the mixture thus prepared with continued mixing, for example, through the use of a mixing blade. Addition of the polyol is believed to initiate a reaction with the anhydride, thereby forming a half acid/half ester. The temperature of the mixture can be increased to about 70° C. to about 80° C., such as about 75° C., over a period of about 10 to about 30 minutes, such as about 20 to about 30 minutes, with continued mixing of the components. During this time, the epoxy composition begins to cure and the viscosity of the mixture slowly increases. During this initial partial curing, the viscosity of the composition can be increased to about 300 to about 900 centipoise (cps) at 75° C. As such, a pre-reacted intermediate product is formed. In one embodiment, this intermediate product has a number average molecular weight of from about 300 to about 1,000.

To form the molding compound, this intermediate product can be further partially cured. Desirably, the intermediate product is transferred to cavities or molds for B-staging of the composition. B-staging of the composition helps to speed molding times during subsequent molding encapsulation procedures by polymerizing the epoxy composition at a comparatively low temperature, making it possible to produce a stable molding compound which will be satisfactorily moldable in a subsequent molding encapsulation procedure with a short curing period. B-staging can be effected at a temperature in the range of about 50° C. to about 100° C., more desirably about 60° C. to about 80° C., most desirably at about 65° C., for a period of about 30 minutes to about 24 hours, preferably from about 10 to about 20 hours, when no catalyst is used. With catalyst, the times may be from ¼ to ⅔ of those noted.

B-staging can be continued until a spiral flow of about 25 to about 50 inches, such as about 30 to about 40 inches, is achieved, using testing procedures well known in the art. Such B-staging results in formation of a partially cured molding compound, i.e., having approximately 40% to 60% of the epoxy moieties of the epoxy compound being reacted. As such, the molding compound is sufficiently polymerized so as to be cured quickly in a subsequent molding operation. After B-staging, the resin may be ground and pelletized. Alternatively, it can be B-staged to a pre-form shape in a suitably sized mold and, after ejection from the mold, may be employed directly. In this manner, the molding compound acquires the shape of the mold, producing a stable product, such as a pellet, for later curing during an encapsulation process.

In a particular embodiment of the invention, the IR absorbing dye can be incorporated into a transparent molding compound by combining a cycloaliphatic anhydride, an epoxy containing component, a fatty acid and the dye by heating to between 105° C. and 110° C. and mixing for approximately 20 minutes. A uniform liquid mixture results, in which the dye is dissolved. The material is then cooled to about 85° C. and silanes and linear glycols are added and mixed for about 10 to about 20 minutes at about 83-87° C. or until the linear glycols are completely dissolved. A catalyst is then added at about 85° C. and mixed for about 3 to 5 minutes until uniformly dispersed. In many instances, this process is performed under vacuum. The resulting liquid material is poured into trays and partially cured or B-staged. The B-staged material can either be transfer molded as is, if pellets were cast, or crushed and pelletized using compression pelletizing methods.

The molding compound can have a weight average molecular weight of above about 1,400, desirably from about 5,000 to about 20,000, due to the partial curing of the epoxy composition. As such, the molding compound represents a reaction product of the intermediate product, which is itself a partially-cured epoxy composition having the antioxidant material.

As discussed, the molding compound of the present invention can be provided in a substantially solid form, such as a pellet. Molding compositions provided in such pellet form for use, for example, in transfer press molding applications, are known in the art and typically involve an epoxy containing compound in which the epoxy composition has been partially reacted to form a partially-cured reaction product. By incorporating the dye and optional antioxidant material into the molding compound within the partially reacted structure thereof, the dye and optional antioxidant material can be maintained evenly throughout the structure of the molding compound. Accordingly, during final curing of the molding compound during encapsulation, the dye can be maintained in a substantially uniform distribution throughout the molding compound, thereby resulting in an encapsulated electronic component in which the fully cured encapsulant includes a dye evenly and homogeneously distributed throughout the structure thereof.

An advantage of the present molding compounds is achieved in the ability to B-stage the molding compounds. Thus, although cycloaliphatic epoxy resins are reputed to be useful as encapsulants, they are liquids and cannot be B-staged with HHPA. Any initial reaction between the anhydride, linear polyol and cycloaliphatic resin would form a cross-linked pellet which would not flow when heated and would, therefore, not be useful as a molding composition for the present invention.

An embodiment of the invention is directed to a method of encapsulating an optoelectronic device that includes:

a) providing an optoelectronic device;

b) providing a molding compound comprising a partially-cured epoxy containing component including a dye that absorbs infrared radiation and substantially transmits light as described above;

c) encapsulating the optoelectronic device with the molding compound; and d) fully curing the epoxy containing component.

In the method for encapsulating an optoelectronic device using such a molding compound, the optoelectronic device, such as an optical sensor, is provided, along with a molding compound which includes the IR absorbing dye and an optional antioxidant material mixed within a partially-cured epoxy composition. The optical sensor is encapsulated with the molding compound and the epoxy composition is fully cured.

More particularly, molding processes using the prepared molding compound may be accomplished by any known method, including utilization of pre-forms and transfer molding or compression molding, wherein the polymer is thermoset to final structure. Primarily, the present molding compounds are intended for transfer molding. After curing, the finished product is ejected from the mold and such removal may often be effected immediately, without the need for any cooling. The polymer is normally employed to cover, strengthen, rigidify and/or insulate an enclosed material and such is present in the mold during the curing operation. Molding can be accomplished in short time periods, as low as about 45 seconds and normally within the range of about one to about six minutes, at a temperature of about 130° C. to about 175° C., preferably from about 140° C. to about 160° C. Molding pressures (transfer molding) may be varied widely but will normally be in the range of about 300 to 2,000 lbs./sq. in.

Embodiments of the invention provide an optoelectronic device including a light-emitting diode, photodiode or optical sensor having an encapsulant surrounding the light-emitting diode, photodiode or optical sensor. The encapsulant includes a reaction product of a cured epoxy containing component including a linear polyol, an IR absorbing dye that absorbs infrared radiation and substantially transmits light as described above. An antioxidant, one or more adhesion promoters, release agents and/or catalysts may optionally be included.

In a particular embodiment of the invention, the optoelectronic device is a photodiode and, in more particular embodiments, a silicon photodiode. As used herein, the term "photodiode" refers to devices that act as light-controlled variable resistors. When exposed to an external light source, internal resistance decreases and current flow increases.

Although an important application of the present molding compounds relates to optical sensors covered, stabilized and protected by the cured compositions in operations in which preformed or particulate molding compounds are utilized, the polymers and molding compounds are not limited to such applications, but can find more general uses as structural materials, printed circuit substrates, potting compounds, encapsulants, insulators, etc., where filtering is required.

Thus, embodiments of the invention are directed to optoelectronic devices, such as light-emitting diodes (LED), photodiodes and sensors, in particular optical sensors encapsulated with the compounds and formulations described above.

In a further aspect, the present invention also provides an optoelectronic device in the form of an optical sensor, photodiode, or light-emitting diode having an encapsulant surrounding the sensor, photodiode or light-emitting diode. The encapsulant can be the reaction product of a cured epoxy composition having an IR absorbing dye and an optional antioxidant material substantially uniformly distributed therethrough, as described hereinabove. Such an optoelectronic device is depicted generally in FIG. 1.

FIG. 1 depicts an optoelectronic device 10 which includes an optical sensor 20 encapsulated by an encapsulant 50. Optical sensor 20 may be any sensor as is known in the art. Optoelectronic device 10 further includes lead wires 42 and 44. Lead wire 42 is in electrical communication with the lower ohmic contact of sensor 20, and lead wire 44 is in electrical communication with the upper ohmic contact of sensor 20, for example through bond wire 46.

Optoelectronic device 10 further includes encapsulant 50 surrounding and encapsulating sensor 20. Encapsulant 50 includes a reaction product of a cured epoxy composition having an IR absorbing dye and optional antioxidant material substantially uniformly distributed therethrough, as is described in detail hereinabove. Encapsulant 50 surrounds sensor 20 and may be formed in the shape of a dome, with relatively large dimensions as compared to sensor 20. Encapsulant 50 may be formed about sensor 20 through a transfer molding process, as is known in the art.

Sensor 20 is activated by an external light source, which causes the sensor to become "active." When visible light strikes encapsulant 50, it is transmitted through encapsulant 50 and detected by sensor 20. The filtering action of the dye prevents infrared light from penetrating through encapsulant 50 to sensor 20, preventing the occurrence of false signal generation from sensor 20.

The present invention will be further exemplified through the following examples, which demonstrate the preparation of molding compositions of the present invention, as well as comparisons of such molding compositions with prior art compositions. Unless otherwise indicated in the examples and elsewhere in the specification and claims, all parts and percentages are by weight, temperatures are in degrees centigrade and pressures are at or near atmospheric pressure.

EXAMPLES 1 AND 2

Figure 2A:
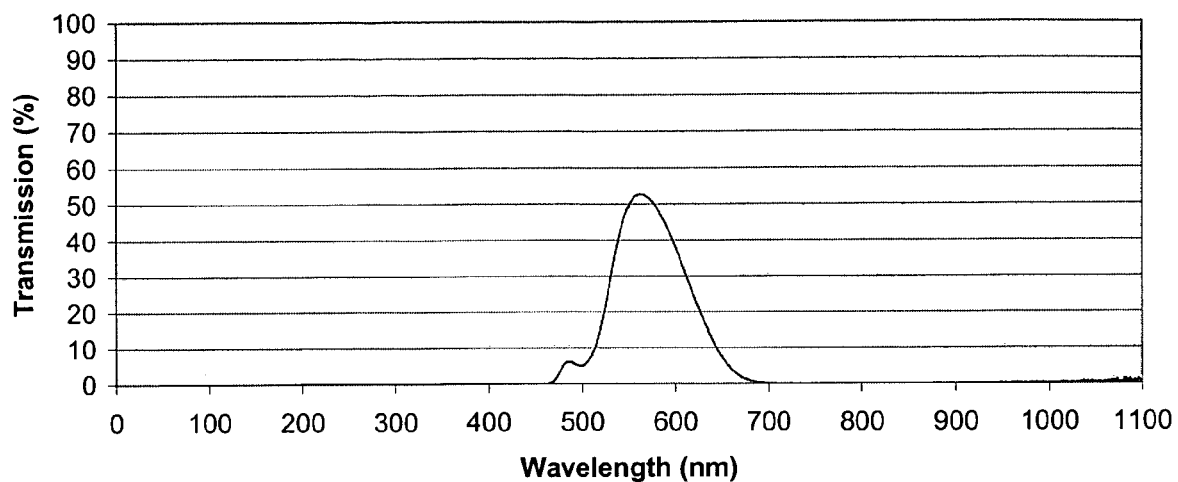
FIGS. 2A, 2B and 2C show transmittance spectra of an IR absorbing dye at 1% in a molding composition according to the invention before and after an in-mold cure.
Figure 2B:
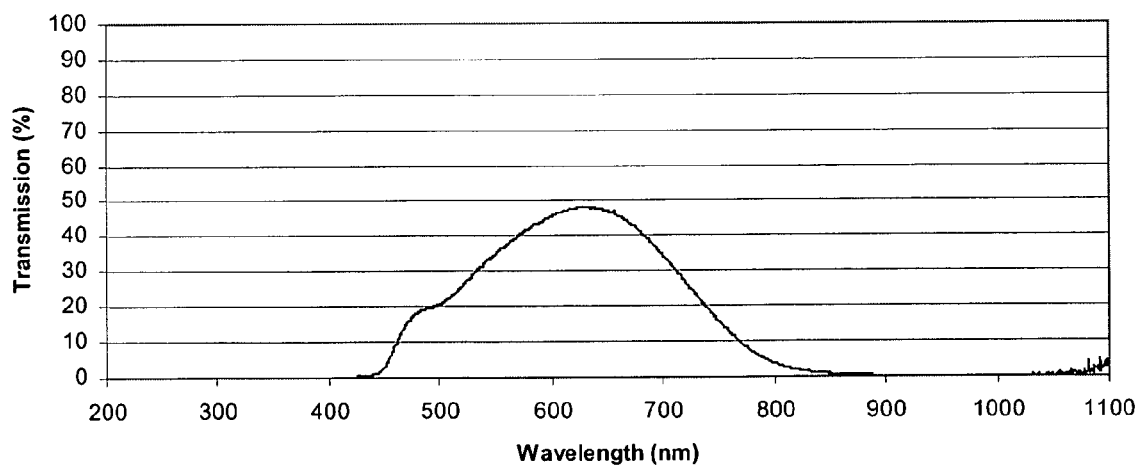
Figure 2C:
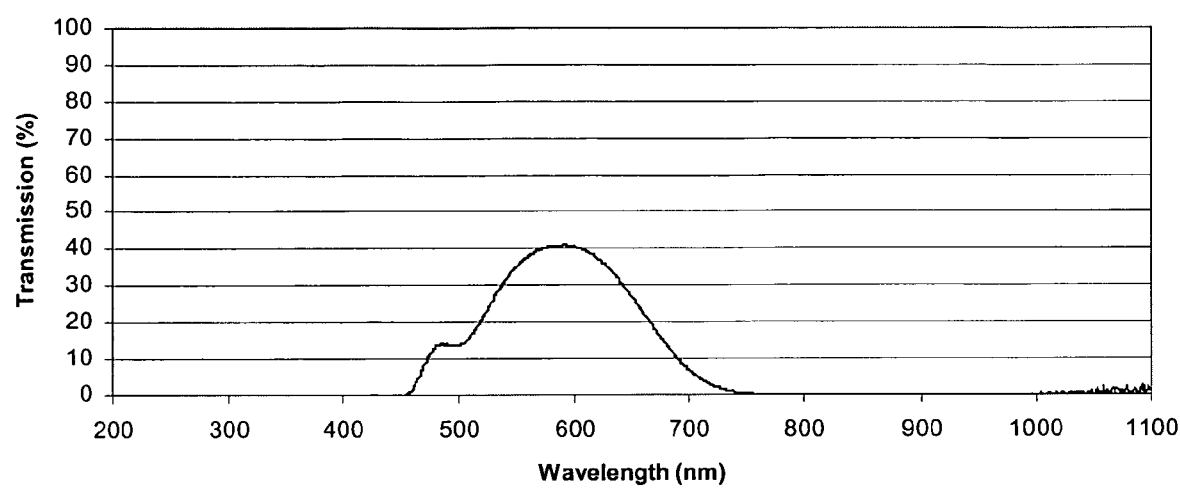
Figure 3A:
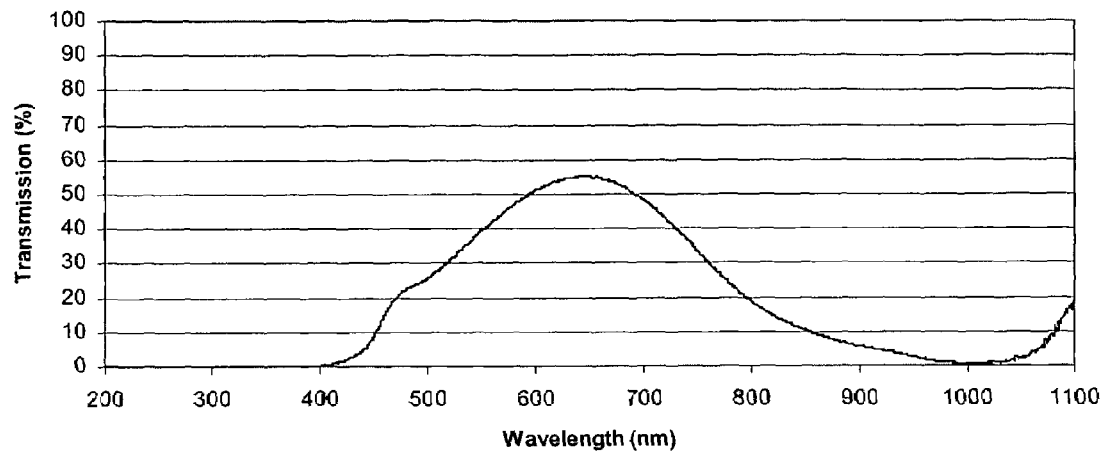
FIGS. 3A and 3B show transmittance spectra of cured molding compositions.
Figure 3B:
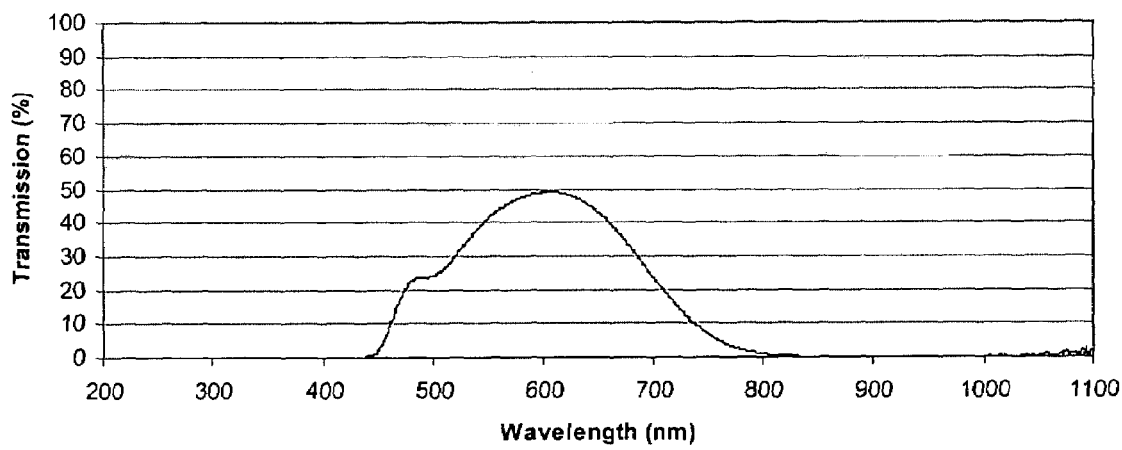

The materials in Table 1 were combined, poured into trays and B-staged and then transferred molded to form a 0.9 mm solid sample thickness, cured for 3 minutes at 150° C. and post cured for four hours at 150° C. The transmission spectra of the particular dye used and of the cured samples (3 minutes at 150° C.) were measured on a AGILENT® UV/Visible Spectrophotometer Model 8453 (Agilent Technologies Inc., Palo Alto, Calif.) and appear in FIGS. 2A (Example 1, as a liquid, not B-staged or cured), 2B (Example 1) and 2C (Example 2). The transmission spectra of the post cured samples (four hours at 150° C.) were measured as described above and appear in FIGS. 3A (Example 1) and 3B (Example 2).

TABLE 1

|  | Example 1 | Example 2 |
| --- | --- | --- |
| hexahydrophthalic anhydride | 49.85 | 49.85 |
| triglycidyl isocyanurate | 38.00 | 38.00 |
| stearic acid | 1.00 | 1.00 |
| SDA8817[1] | 1.00 | 1.00 |
| epoxy silane[2] | 0.50 | 0.50 |
| mercapto silane[3] | 0.50 | 0.50 |
| neopentyl glycol | 8.95 | — |
| glycerin | — | 8.95 |
| zinc octoate | 0.20 | 0.20 |

[1]Dye available from H. W. Sands Corp., Jupiter, FL
[2]DOW CORNING Z-6040 ® (Dow Corning Corp., Midland, MI)
[3]DOW CORNING Z-6062 ® (Dow Corning Corp., Midland, MI)

The transmission spectra show a general broadening of the transmittance curves, especially in the 700 nm to 1100 nm range compared to the dye by itself. This effect was much more pronounced when neopentyl glycol was used as the polyol (Example 1) as compared with glycerin (Example 2), where there was virtually no transmittance between 800 nm and 1100 nm for the latter.

EXAMPLES 3-5

Figure 4A:
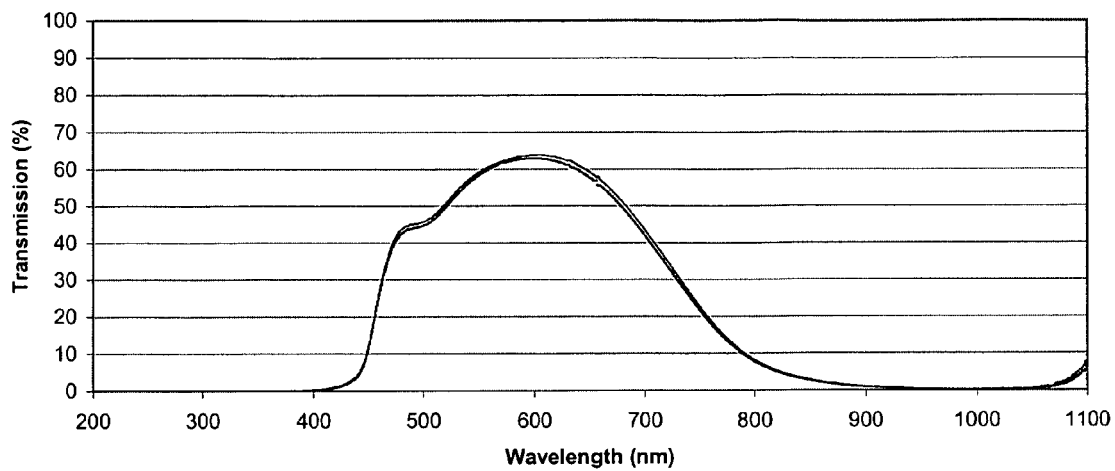
FIGS. 4A, 4B and 4C show transmittance spectra of cured and heat aged molding compositions according to the invention.
Figure 4B:
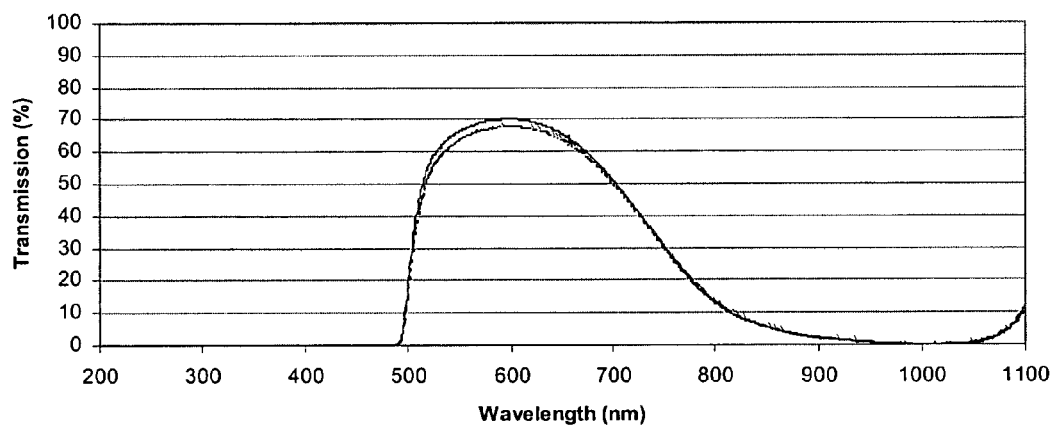
Figure 4C:
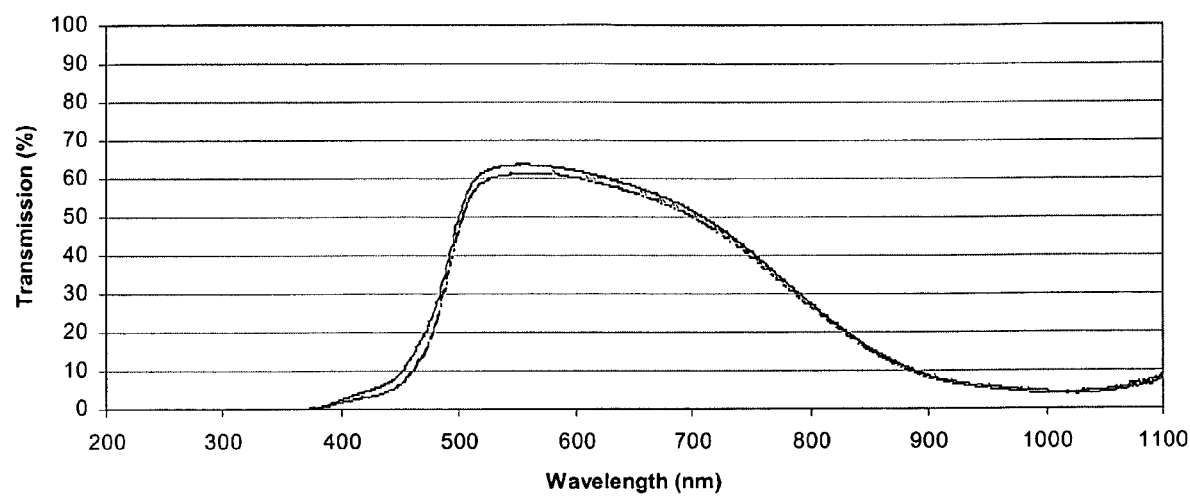

The transmission spectra of the particular dye used and of the cured samples (formulations in Table 2) were measured as described above and appear in FIGS. 4A (Example 3), 4B (Example 4) and 4C (Example 5) (solid line—formulation initially, dashed line—after heat aging at 125° C. for 70 hours).

TABLE 2

| | Example 3 | Example 4 | Example 5 |
|---|---|---|---|
| hexahydrophthalic anhydride | 51.27 | 51.14 | 51.40 |
| triglycidyl isocyanurate | 39.08 | 38.98 | 39.18 |
| stearic acid | 1.00 | 1.00 | 1.00 |
| SDA8817[1] | 0.50 | — | — |
| SDA6535[1] | — | 0.75 | — |
| SDA6592[1] | — | — | 0.25 |
| glycerin | 8.15 | 8.13 | 8.17 |

[1]Dye available from H. W. Sands Corp., Jupiter, FL

The transmission spectra show that a number of dyes can be used to obtain the desired filter effect and that the amount of dye can be varied to provide the desired absorbance/transmittance characteristics in the cured composition.

The full scope of the invention is measured by the claims.

What is claimed is:

1. A composition, comprising:
   a) an epoxy containing component;
   b) an anhydride containing component;
   c) a dye that absorbs infrared radiation in the region of above 700 nm to about 1200 nm and substantially transmits light in the region of about 400 nm to 700 nm; and
   d) a linear polyol;
   wherein the composition is free of any added branched or bulky polyol; and
   wherein the composition, when cured, has at least 40% transmittance at 600 nm, less than 10% transmittance at 900 nm, and less than 10% transmittance at 1100 nm.

2. A composition as in claim 1, wherein said epoxy containing component comprises epoxy monomers within structures I and II represented as:

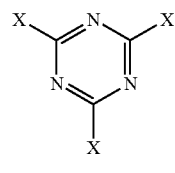

(I)

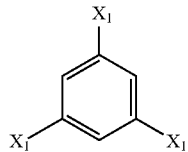

(II)

where X on structure I is a member selected from H or $D_n$A, provided at least one of X is $D_n$A, where n ranges from 0 to 1; where D is attached to the ring and is selected from o, S, or NH; and A is attached to D, if D is present, or to the ring if D is not present, and is represented by structure III:

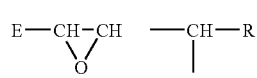

(III)

where L is a member selected from: H; linear, branched or cyclic alkyl group having from 1 to 20 carbon atoms; linear, branched or cyclic alkenyl group having from 1 to 20 carbon atoms; linear, branched or cyclic alkynyl group having from 1 to 20 carbon atoms; linear, branched or cyclic alkoxy group having from 1 to 20 carbon atoms; or aryl group; said alkyl, alkenyl, alkynyl, alkoxy, and aryl groups with or without substitution by halogen, silicon, hydroxy, nitrile, ester, amide, or sulfate;

where R is a member selected from: H; linear, branched or cyclic alkyl group having from 1 to 20 carbon atoms; linear, branched or cyclic alkenyl group having from 1 to 20 carbon atoms; linear, branched or cyclic alkynyl group having from 1 to 20 carbon atoms; linear, branched or cyclic alkoxy group having from 1 to 20 carbon atoms; or aryl group; said alkyl, alkenyl, alkynyl, alkoxy, and aryl groups with or without substitution by halogen, silicon, hydroxy, nitrile, ester, amide, or sulfate; and where $X_1$ on structure II is a member selected from H or $O=CD_nA$, provided that at least one $X_1$ is $O=CD_nA$, where n ranges from 0 to 1; where D is selected from O, S, or NH; and A is represented by structure III.

3. A composition as in claim 1, wherein said epoxy containing component comprises materials within the structure represented by:

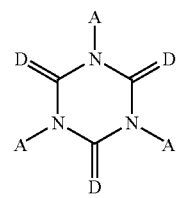

(IV)

where D is a member selected from O, S, or NH; and A is represented by the structure:

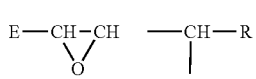

(III)

where E is a member selected from: H; linear, branched or cyclic alkyl group having from 1 to 20 carbon atoms; linear, branched or cyclic alkenyl group having from 1 to 20 carbon atoms; linear, branched or cyclic alkynyl group having from 1 to 20 carbon atoms; linear, branched or cyclic alkoxy group having from 1 to 20 carbon atoms; or aryl group; said alkyl, alkenyl, alkynyl, alkoxy, and aryl groups with or without substitution by halogen, silicon, hydroxy, nitrile, ester, amide, or sulfate;

where R is a member selected from: H; linear, branched or cyclic alkyl group having from 1 to 20 carbon atoms; linear, branched or cyclic alkenyl group having from 1 to 20 carbon atoms; linear, branched or cyclic alkynyl group having from 1 to 20 carbon atoms; linear, branched or cyclic alkoxy group having from 1 to 20 carbon atoms; or aryl group; said alkyl, alkenyl, alkynyl, alkoxy, and aryl groups with or without substitution by halogen, silicon, hydroxy, nitrile, ester, amide, or sulfate.

4. A composition as in claim 1, wherein said epoxy containing component comprises materials within the structure represented by:

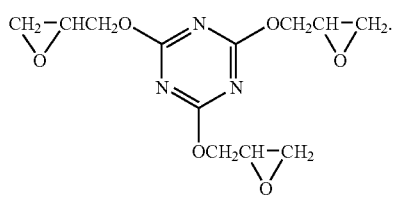

(V)

5. A composition as in claim 1, wherein said epoxy containing component comprises materials within the structure represented by:

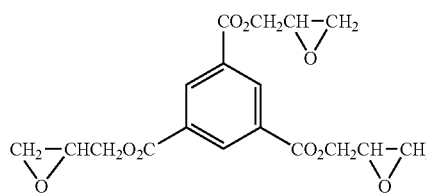

(VI)

6. A composition as in claim 1, wherein said epoxy containing component comprises materials within the structure represented by:

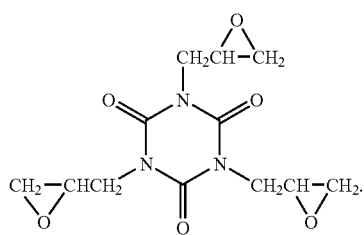

(VII)

7. A composition as in claim 1, wherein said epoxy containing component comprises triglycidyl isocyanurate.

8. A composition as in claim 1, wherein said anhydride containing component comprises a cycloaliphatic anhydride.

9. A composition as in claim 1, wherein said anhydride containing component comprises methyl hexahydrophthalic anhydride and br hexahydrophthalic anhydride.

10. A composition as in claim 1, wherein the composition has a transmiffance of less than 10% at 850 nm.

11. A composition as in claim 10, wherein said linear polyol is selected from the group consisting of glycerol, ethylene glycol, diethylene glycol, propylene glycol, dipropylene glycol, triethylene glycol, tripropylene glycol, and mixtures thereof.

12. A composition as in claim 1, further comprising at least one of an antioxidant material, an adhesion promoter, a release agent and a catalyst.

13. A composition as in claim 12, wherein said antioxidant material comprises an alkyl salt of propionic acid.

14. A composition as in claim 12 wherein said antioxidant material comprises thiodiethylene bis.

15. A composition as in claim 1, wherein said dye absorbs infrared radiation in the region of about 770 nm to about 1100 nm and substantially transmits light in the region of about 450 nm to about 650 nm.

16. A composition as in claim 1, wherein said epoxy containing component comprises from about 20 weight percent to about 75 weight percent of said composition based on the total weight of the composition;
said anhydride containing component comprises from about 20 weight percent to about 75 weight percent of said composition based on the total weight of the composition;
said dye comprises from about 0.01 weight percent to about 5 weight percent of said composition based on the total weight of the composition; and
said linear polyol comprises from about 0.5 weight percent to about 20 weight percent of said composition based on the total weight of the composition.

17. A molding compound comprising a partially-cured reaction product of the composition of claim 1.

18. An encapsulant material for electronic components, comprising:
a reaction product of the composition of claim 1.

19. An optoelectronic device comprising a photodiode having an encapsulant surrounding said photodiode, wherein said encapsulant is the encapsulant material of claim 18.

20. A method of preparing a molding compound, comprising:
a) providing an epoxy containing component and an anhydride containing component;
b) mixing a linear polyol and a dye that absorbs infrared radiation in the region of above 700 nm to about 1200 nm and substantially transmits light in the region of about 400 nm to 700 nm to provide a homogeneous mixture with a);
c) increasing the viscosity of said homogeneous mixture to form a pre-reacted intermediate; and
d) partially curing said epoxy containing component of said pre-reacted intermediate, thereby forming said molding compound;
wherein the homogenous mixture, pre-reacted intermediate, and molding compound are free of any added branched or bulky polyol; and
wherein partially cured epoxy containing component composition, when molded and post cured, has at least 40% transmittance at 600 nm, less than 10% transmittance at 900 nm and less than 10% transmittance at 1100 nm.

* * * * *

UNITED STATES PATENT AND TRADEMARK OFFICE
CERTIFICATE OF CORRECTION

PATENT NO. : 7,474,009 B2  
APPLICATION NO. : 11/027909  
DATED : January 6, 2009  
INVENTOR(S) : Starkey Page 1 of 1

It is certified that error appears in the above-identified patent and that said Letters Patent is hereby corrected as shown below:

Column 13, Line 63, Claim 2, "where L is a member" should read
-- where E is a member --

Column 15, Line 48, Claim 9, "and br" should read -- and / or --

Column 15, Line 50, Claim 10, "transmiffance" should read -- transmittance --

Column 16, Line 7, Claim 14, "bis." should read
-- bis[3-(3,5-di-tert-butyl-4-hydroxyphenyl)propionate]. --

Column 16, Line 48, Claim 20, "homogenous" should read -- homogeneous --

Signed and Sealed this

Sixteenth Day of June, 2009

JOHN DOLL  
*Acting Director of the United States Patent and Trademark Office*